US009031121B2

(12) United States Patent
Haase et al.

(10) Patent No.: US 9,031,121 B2
(45) Date of Patent: May 12, 2015

(54) ELECTRONIC CIRCUIT AND METHOD FOR RECOVERING DESIRED SIGNALS FROM CARRIER SIGNALS BY DEMODULATION AS WELL AS A MODEM

(71) Applicant: Endress + Hauser Conducta Gesellschaft für Mess- und Regeltechnik mbH + Co. KG, Gerlingen (DE)

(72) Inventors: Bjorn Haase, Stuttgart (DE); Stefan Pilz, Geithain (DE)

(73) Assignee: Endress + Hauser Conducta Gesellschaft für Mess- und Regeltechnik mbH + Co. KG, Gerlingen (DE)

( * ) Notice: Subject to any disclaimer, the term of this patent is extended or adjusted under 35 U.S.C. 154(b) by 75 days.

(21) Appl. No.: 13/711,793

(22) Filed: Dec. 12, 2012

(65) Prior Publication Data

US 2013/0163651 A1 Jun. 27, 2013

(30) Foreign Application Priority Data

Dec. 16, 2011 (DE) ........................ 10 2011 088 810

(51) Int. Cl.

| | |
|---|---|
| ***H04B 1/10*** | (2006.01) |
| ***H04B 1/16*** | (2006.01) |
| ***H04B 1/38*** | (2006.01) |
| ***H04B 15/00*** | (2006.01) |
| ***H03D 1/18*** | (2006.01) |

(52) U.S. Cl.

CPC .. *H04B 1/10* (2013.01); *H04B 1/16* (2013.01); *H04B 1/38* (2013.01); *H04B 15/00* (2013.01); *H03D 1/18* (2013.01)

(58) Field of Classification Search

CPC ............ H04B 1/10; H04B 15/00; H04B 1/16; H04B 1/38; H03D 1/18

USPC ......... 375/219, 222, 259, 285, 316, 324, 325, 375/326, 346, 350

See application file for complete search history.

(56) References Cited

U.S. PATENT DOCUMENTS

| | | | | |
|---|---|---|---|---|
| 4,339,727 | A | 7/1982 | Kage | |
| 4,878,252 | A * | 10/1989 | Sessink | 455/276.1 |
| 5,440,244 | A * | 8/1995 | Richter et al. | 326/37 |

(Continued)

FOREIGN PATENT DOCUMENTS

| | | |
|---|---|---|
| CA | 2 705 969 | 12/2011 |
| DE | 4239374 | 5/1994 |

(Continued)

*Primary Examiner* — Jean B Corrielus

(74) *Attorney, Agent, or Firm* — Bacon & Thomas, PLLC

(57) ABSTRACT

An electronic circuit comprising a rectifier which passes only one polarity of a carrier signal; at least one filter, subsequent to the rectifier, for the suppression of at least one frequency range of the carrier signal; a voltage matching network, subsequent to the filter, which is embodied so that it matches the voltage of the desired signal, and leads to one of the two inputs of a comparator, wherein an output of the comparator is switched, depending on the difference between the two inputs, and a feedback network connected in parallel with the comparator, wherein the feedback network connects one of the two inputs of the comparator with the output of the comparator, the feedback network comprises a high-pass characteristic. The invention furthermore comprises a method for the recovering of desired signals from a carrier signal by demodulation and a modem.

9 Claims, 6 Drawing Sheets

(56) References Cited

U.S. PATENT DOCUMENTS

| | | | | |
|---|---|---|---|---|
| 5,499,268 | A * | 3/1996 | Takahashi | 375/231 |
| 5,548,570 | A | 8/1996 | Hirajima | |
| 5,602,871 | A | 2/1997 | Scholz | |
| 5,760,629 | A * | 6/1998 | Urabe et al. | 327/307 |
| 6,169,764 | B1 | 1/2001 | Babanezhad | |
| 7,061,313 | B2 * | 6/2006 | Kimball et al. | 330/103 |
| RE40,038 | E * | 1/2008 | Shakiba | 375/319 |
| 7,405,659 | B1 * | 7/2008 | Hyde | 340/572.4 |
| 2007/0057721 | A1 | 3/2007 | Risbo | |
| 2007/0109163 | A1 | 5/2007 | Lai | |
| 2008/0224982 | A1 * | 9/2008 | Yamazaki | 345/98 |
| 2011/0096878 | A1 * | 4/2011 | Mattisson | 375/350 |

FOREIGN PATENT DOCUMENTS

| | | | |
|---|---|---|---|
| DE | 102006062598 | A1 | 7/2008 |
| JP | 57118409 | A | 7/1982 |
| WO | WO 2008/080758 | A1 | 7/2008 |

* cited by examiner

ELECTRONIC CIRCUIT AND METHOD FOR RECOVERING DESIRED SIGNALS FROM CARRIER SIGNALS BY DEMODULATION AS WELL AS A MODEM

TECHNICAL FIELD

The invention relates to an electronic circuit and method for recovering desired signals from carrier signals by demodulation as well as a modem.

BACKGROUND DISCUSSION

The desired signal (the "information") that is to be transmitted must be converted into a suitable format for transmission. For this purpose, a so called carrier signal is altered by a desired signal. This proceeding is called modulation. The reverse operation, i.e. the filtering out of a desired signal from a carrier signal, is called demodulation. A system that demodulates as well as modulates is referred to as a modem.

The binary transmission of digital signals is thereby achieved, in the simplest case, when a two level square wave signal is used. In this case, it can be switched between two amplitudes, frequencies or phases. The present invention is related to the application of amplitude modulation. In the transmission of digital signals, one speaks of keying rather than of modulation, and in the sense of the invention, of amplitude shift keying (ASK).

Inductively coupled plug-and-socket connections, such as those that are proffered under the designation "Memosens" by the applicant, are, by way of example, suitable for this sort of data transmission.

Inductively coupled plug-and-socket connections are employed in practice, if electrical signals are supposed to be transmitted without electrical contact. Through this galvanic isolation, advantages reveal themselves with regards to corrosion protection, isolation of potentials, prevention of mechanical wear of the plug, etc.

The inductive interface is usually embodied as a system with two solenoids, which are, by way of example, inserted into each other. Typically, data as well as energy is transmitted.

According to the prior art, data sent by means of ASK is extracted in the process of demodulation, by way of example, by an envelope detector and a subsequent comparator, often with hysteresis. In FIG. l*a*, the upper signal threshold of the comparator is designated as A.1 and the lower signal threshold of the comparator is designated as A.2. Above A.1 is detected as logic "high" or "1", and underneath A.2 is detected as logic "low" or "0".

As mentioned above, the transmission occurs in the form of, in the ideal case, a square wave signal modulation, as is shown by the reference character B in FIG. 1*a*. A simple and proven method for the generation of a signal modulation is the application of switching means. High frequency signal components can be generated with each level-change via the circuit components used at the two solenoids for the generation of the signal modulation, especially when using high slew rate switching means. Of particular importance are the signal components that are in the region around the characteristic resonance frequencies of one of the two solenoids that can for example arise from parasitic capacitance layer between the windings. These noise signals have the form of an overdamped oscillation, as is shown in FIG. 1*a* by the reference character C.1 for a falling edge and C.2 for a rising edge. For these overdamped oscillations, an envelope can be defined that characterizes the damping of the noise signal.

It is possible for these high frequency noise components to interfere with the desired signal, thereby distorting and preventing a successful transmission. This problem is illustrated in FIG. 1*a* with the desired accurate signal sequence (D.1) and the inaccurately detected signal sequence (D.2): For the level-change "high-low", the comparator initially, and accurately, detects "0". However, in the course of time, the noise components of the desired signal oscillate up past the upper signal threshold A.1 of the comparator, which then in the meantime inaccurately registers a "1" and consequently the desired signal is inaccurately transmitted. The analogous goes for a "low-high" level-change.

Furthermore, the noisy signal components, with respect to their frequencies, can be in the region of the frequency band used for the amplitude modulation.

SUMMARY OF THE INVENTION

It is therefore an object of the present invention to provide an electronic circuit, a method and a modem, which guarantee an accurate demodulation/modulation.

The object is achieved by means of an electronic circuit, wherein the to be demodulated carrier signal along with the desired signal, is inputted from a signal port, comprising

- a rectifier which passes only one polarity of the carrier signal,
- at least one filter, subsequent to the rectifier, for the suppression of at least one frequency range of the carrier signal,
- a voltage matching network, subsequent to the filter, which is embodied so that it matches the voltage of the desired signal, and leads to one of the two inputs of a comparator, wherein an output of the comparator is switched, depending on the difference between the two inputs, and

- a feedback network connected in parallel with comparator, wherein the feedback network connects one of the two inputs of the comparator with the output of the comparator, and wherein the feedback network comprises high-pass characteristic.

A desired signal is used to modulate a carrier signal through Amplitude Shift Keying (ASK) and then is carried to the signal input port. Next, the carrier signal is rectified, i.e. only one polarity is passed through, by a rectifier. Thereafter, at least one frequency range of the carrier signal is suppressed with a subsequent filter, while leaving the envelope of the desired signal intact. This signal is then matched by a voltage matching network, so that it can be led to one of the inputs of the comparator. A feedback network with high-pass characteristic is connected in parallel to the comparator. In FIG. 1*b*, the progression of the signal of the feedback network with high-pass characteristic is schematically illustrated.

This is considered to be advantageous. In the interplay between the filter and the feedback network with high-pass characteristic, it is possible to suppress the high frequency noise components.

In this, the feedback network functions, in combination with the non-linearity introduced through the comparator and the filter connected to the rectifier, as a non-nonlinear filter, which, after registering a level change, more effectively suppresses the expected high frequency noise signals on the rectifier than a linear filter. This suppression is then especially effective if the high-pass characteristic of the feedback network is matched to the expected noise frequencies, i.e. the cutoff frequency of the high-pass is below the problematic noise frequencies.

In a preferred embodiment, the feedback network is embodied as a positive feedback network. A small difference between the two inputs can thereby be amplified and the desired signal can be optimally reconstructed.

The function of the positive feedback of the feedback network with high-pass characteristic can also be understood as follows, that the comparator is operated with a hysteresis, which is no longer constant in time but rather takes on a progression in time that compensates for the noise signals in the end that are expected from a level change with a large hysteresis. In FIG. 1*b*, the wave form of the feedback network with high-pass characteristic has to be added to the thresholds A.1 and A.2, respectively. Ideally, the high-pass characteristic of the feedback network falls off with exactly the rate of decay of the envelope of the noise signals. Thereby, for the duration of the expected noise signal oscillation, the desired hysteresis of the comparator for a level change is increased to the magnitude of the expected envelope of the noise signal. An advantage to this is that the impulse response of the feedback network with high-pass characteristic is fitted to the signal form and signal amplitude of the expected noise signal.

The noise of the transmitted desired signal is damped through the fed-back high frequencies. The noise is thereby removed from the desired signal and an error free transmission is guaranteed.

The comparator with the feedback network can be characterized as a specially embodied Schmitt-Trigger.

Provided in an advantageous embodiment is an input coupling network, which precedes the comparator and is embodied so that it inputs a control signal. It is thereby possible to offset the electrical circuit in a defined initialization state. If, by way of example, a defined "low-high" edge is inputted, then the comparator can be reliably elevated above the threshold and initialized in the state "high" at the output. It can thereby be secured that the signal transmission begins correctly and the requirements for a successful data transmission are fulfilled.

It is possible for this initialization to take place at the beginning of every transmission. It is also possible for the initialization to occur at the end of every transmission.

In a preferable embodiment the input coupling network is a capacitive coupling with a digital control signal. In this way, some digital output of a component can be used to offset the electronic circuit in an initialization state.

Preferably the rectifier is a half wave rectifier, in particular a diode.

In an advantageous embodiment, the filter is a low-pass, high-pass and/or bandpass. Through the use of a low-pass filter the high frequency carrier signal can be filtered off. Through the implementation of high-pass it is possible to securely separate low frequency signal-noise components from the communication signal detected at the signal input of the electronic circuit. These sorts of low frequency noise signals can possibly arise, among other ways, when a connected consumer load temporarily comprises an increased current demand, which leads to an increased load on the signal input and from there to a break in the voltage supplied there.

In a preferable embodiment the filter comprises exclusively passive components. Thereby only a small area is needed and the current and energy demands are smaller and therefore the costs that arise are smaller.

The object is further achieved by a method, comprising the following steps initialization,
rectification of the carrier signal,
filtering of the carrier signal,
matching the voltage of the desired signal,
comparing the desired signal with a comparison signal,
feedback of the desired signal with high-pass characteristic, and
outputting of the desired signal.

This is seen as advantageous. Through the initialization, the precondition for a successful transmission is achieved. After the rectification and filtering of the carrier signal, the enclosed desired signal is subsequently fitted and compared with a comparison signal. Subsequently, the desired signal is fed-back with high-pass characteristic. In the last step, the desired signal is outputted.

The comparison signal can comprise, for instance, the feedback signal or can be realized through a constant voltage.

The object is further achieved by a modem comprising the electronic circuit, furthermore comprising a second electronic circuit, wherein the modulated carrier signal is led to a signal input, comprising a load network, and
a circuit switched network for connecting the load network to the signal input.

This is seen as advantageous. Through the circuit switched network, the load network is connected to the signal input. It can thus be achieved that the circuit switched network and the load network, respectively, modulate the carrier signal with a desired signal and thereby enable communication in the opposite direction.

Preferably the circuit switched network comprises at least one circuit transistor.

BRIEF DESCRIPTION OF THE DRAWINGS

The invention will be explained in greater detail on the basis of the following illustrations.

With regard to the figures, the same reference characters are used to identify the same features.

DETAILED DISCUSSION IN CONJUNCTION WITH THE DRAWINGS

Figure 1A:
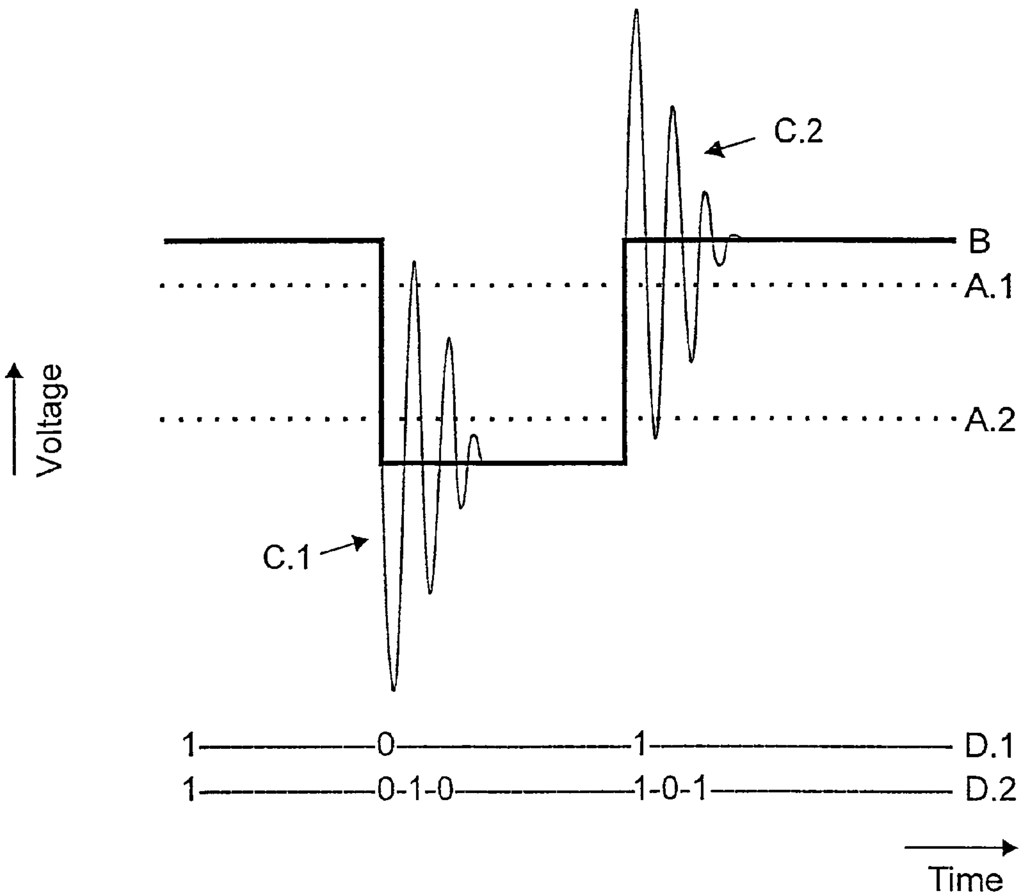
FIG. 1*a* is a schematic representation of the progression in time of an ideal and a real desired signal trace with the thresholds of the comparator.
Figure 1B:
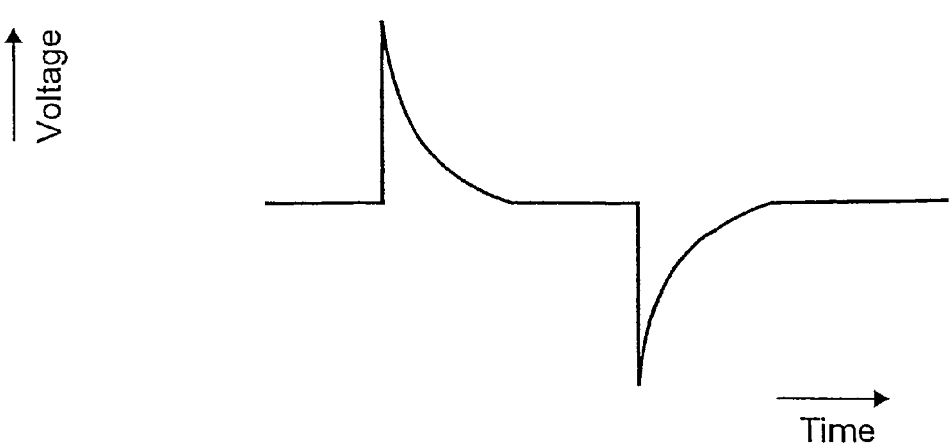
FIG. 1*b* is a schematic representation of the progression in time of the signal of the feedback network with high-pass characteristic.

The electronic circuit, in its entirety, has the reference character 1. The mode of operation of the invention should next be explained schematically on the basis of FIG. 2.

Following the flow of the signal, the electronic circuit 1 comprises the following components: a signal input 2, to which the carrier signal that is ASK-modulated with a desired signal is supplied, a rectifier 3, a filter 4, a voltage matching network 5, an input coupling network 6, a comparator 9 that outputs a demodulated signal at its output 9.3 and a feedback network 7, which connects the output 9.3 with one of the inputs 9.1, 9.2 of the comparator 9.

It is possible that an inductively coupled interface operates as a signal input 2, i.e. the signal entrance 2 is represented by a solenoid. A carrier signal modulated with a desired signal, and as it relates to the invention an ASK signal, is supplied to the signal input 2.

Figure 2:
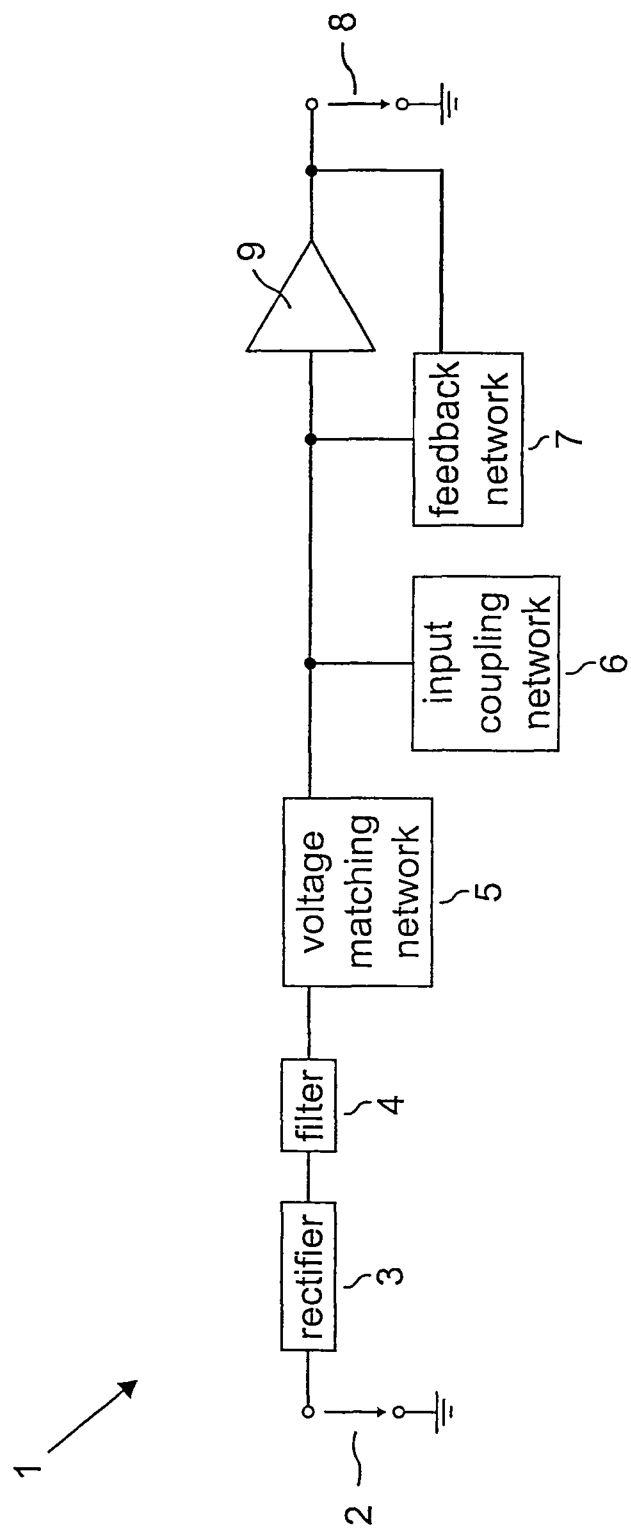
FIG. 2 is a schematic view of the inventive electronic circuit.
Figure 3:
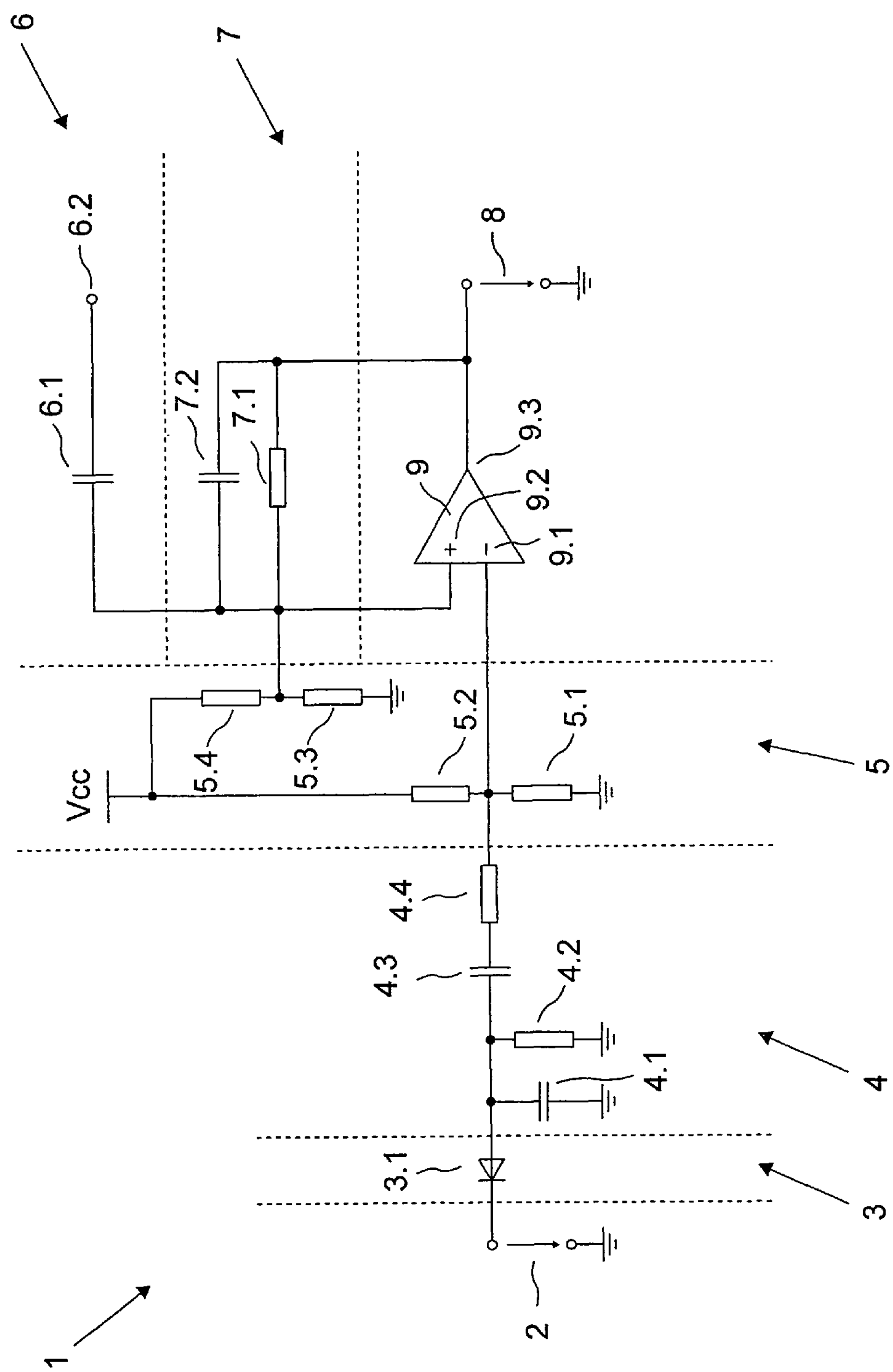
FIG. 3 is a second embodiment of the inventive electronic circuit.
Figure 4:
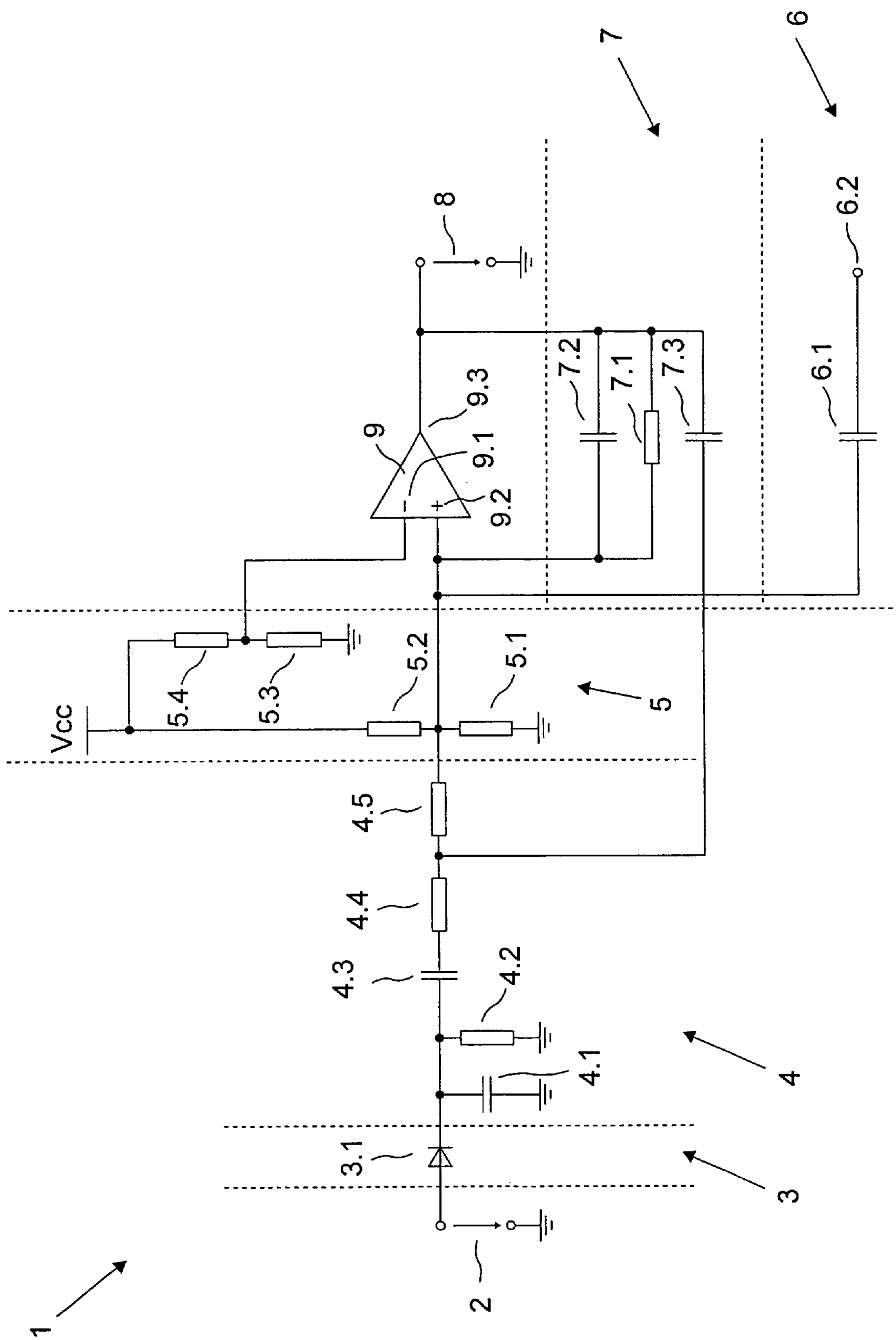
FIG. 4 is a second embodiment of the inventive electronic circuit.

The illustrations FIG. 3 and FIG. 4 show examples of possible implementations of the schematic overview from FIG. 2.

Next, the carrier signal is led to a rectifier 3. The rectifier 3 comprises a diode 3.1. The diode 3.1 only lets through one polarity of the high frequency input signal, so that only half (half wave) of the high frequency oscillations remain. In accordance with the orientation of the diode 3.1, the remainder is the negative (FIG. 3) or the positive (FIG. 4) half.

After this follows a filter 4. In the example these are a low- and high-pass. The low-pass serves for cutting off the high frequency carrier signal. Mostly the low-pass is realized through a capacitor 4.1 and a resistor in parallel 4.2, wherein the capacitor 4.1 and a resistor 4.2 are connected to ground. The rectifier 3 and the low-pass filter together are also referred to as an envelope detector. The high-pass serves to securely separate low frequency signal-noise components. These sorts of low frequency noise signals can possibly arise, among other ways, when a load connected to the output 8 temporarily comprises an increased current demand, which leads to an increased load on the signal input 2 and from there to a break in the voltage supplied there. The high-pass comprises a series circuit of capacitor 4.3 and resistor 4.4.

It is advantageous, regarding the frequency characteristic of the filter 4, to supplement with smaller impedances the impedance of the filter components situated closer in the signal path to the rectifier 3 (capacitor 4.1 and resistor 4.2) than those filter components situated closer to the comparator 9 in the signal path (capacitor 4.4, resistors 4.4, 4.5).

The filter 4 consists exclusively of passive components. This has advantages in terms of space requirements and current demand and hence also in terms of costs. Along with this, with passive filters, a high degree of linearity can be guaranteed. It speaks for itself that active filters with one or more operational amplifiers are possible.

Also, the filter 4 can be of a higher order than the illustrated first order. A greater slew rate can be realized in this way.

The series capacitor 4.3 additionally serves for DC-decoupling of the desired signal.

The voltage matching network 5 comprises two voltage dividers which each consists of two resistors 5.1, 5.2 and 5.3, 5.4 respectively, which are connected between ground (Gnd) and the supply voltage (Vcc). Often, a capacitor is used in parallel with the voltage dividers (not shown). The connection nodes of the resistors 5.1, 5.2 rest in the path of the signal and are led to one of the two inputs 9.1/9.2 of a comparator 9. The connection nodes of the resistors 5.3, 5.4 are led to the other input 9.2/9.1 of the comparator 9.

The previously named components, i.e. diode 3.1, resistors 4.2, 4.4, 5.1, 5.2, 5.3, 5.4 and capacitors 4.1, 4.3 are chosen in such dimensions that the information to be used, which is contained in the modulated ASK signal that is supplied to the signal input 2, is wholly retained.

As previously mentioned, FIG. 3 shows a circuit for recovering a desired signal from negative half waves by demodulation; while FIG. 4 shows a circuit for recovering a desired signal from positive half waves by demodulation. In order for the circuit to function, the signal in question must be fed to the suitable input 9.1, 9.2 of the comparator. In FIG. 3 the signal is fed to the negative input 9.1; in FIG. 4 the signal is fed to the positive input 9.2.

The following is a description of FIG. 3.

An input coupling network 6 is connected to the positive input 9.2. For convenience, a capacitive coupling is chosen. In the example, the input coupling network 6 comprises thereby a series capacitor 6.1, to which a digital control signal is fed via the input 6.2. The control signal can be fed via a digital I/O port of a micro controller, or otherwise. Through the input coupling network 6, it is possible to offset the comparator 9 in a defined initialization state. If, by way of example, a defined "low-high" edge is inputted, then the comparator 9 can be reliably elevated above the threshold and initialized in the state "high" at the outset. It can thereby be secured that the signal transmission begins correctly and the requirements for a successful data transmission are fulfilled.

A feedback network 7 is connected in parallel to the comparator 9. It connects the output 9.3 of the comparator 9 with the positive input 9.2 of the comparator 9. The feedback network 7 comprises a resistor 7.1 as well as a capacitor 7.2 connected in parallel. Thus, the comparator 9 along with the feedback network forms a Schmitt-Trigger.

Through the additional capacitor 7.2, in comparison to a "normal" Schmitt-Trigger, the feedback loop can realize high-pass behavior. Through the interplay of the high-pass behavior of the feedback network 7 with the filter 4, in particular the low-pass, it is possible to suppress the high frequency noise signals that inevitably arise from switching a load.

The circuit for positive half waves in FIG. 4 is similarly constructed. The input coupling network 6 is realized in the same way through a series capacitor 6.1 and a control signal input 6.2. The feedback network 7 also comprises a resistor 7.1 and a capacitor 7.2 in parallel to it. The feedback network 7 is connected from the output 9.3 of the comparator 9 to the positive input 9.2 of the comparator. The input coupling network 6 is connected to the positive input 9.2 of the comparator 9, as well. Since the carrier signal and desired signal, respectively, are also supplied to this input 9.2, only the middle node of the voltage matching network 5, the resistors 5.3, 5.4, respectively, are connected to the negative input 9.1.

Since there is a feedback onto the signal path, the properties of the filter 4 are influenced by the feedback network 7. Through feedback over a capacitor 7.3 via the voltage matching network 5 onwards, the time constant of the filter 4 can be influenced as a side effect. In this case an additional resistor 4.5 is necessary.

The signal produced in this way can be detected at the output 8 of the electronic circuit 1. In this way, the desired signal can e.g. contain control signals, or in general data for a connected micro controller (not shown), or the like.

Figure 5:
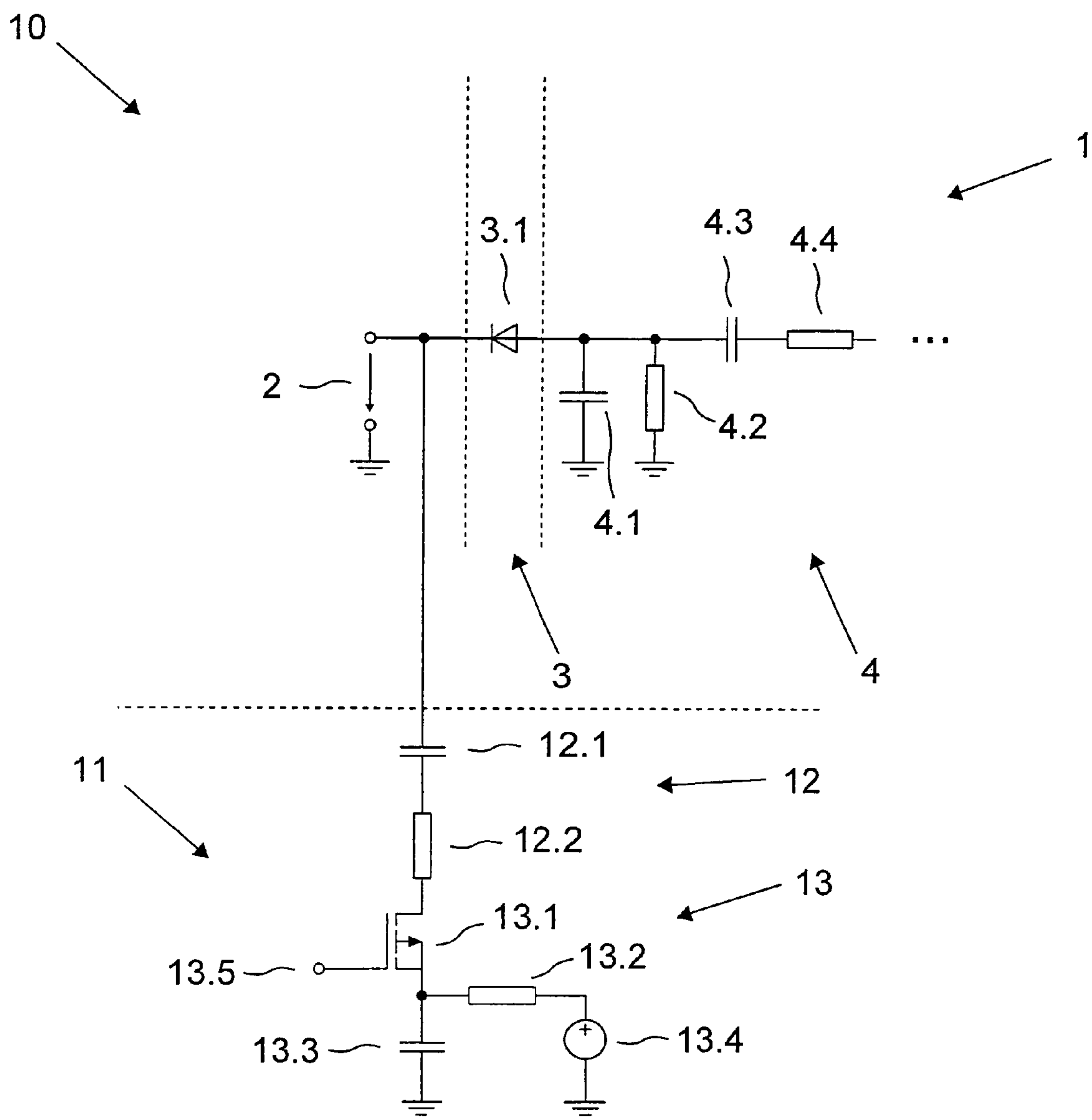
FIG. 5 is the inventive modem, comprising the electronic circuit from FIG. 3 and a modulator.

FIG. 5 shows a modem 10, comprising the electronic circuit 1 and a modulator 11. The electronic circuit 1 is only depicted with a rectifier 3 and a filter 4; the remaining components are to be drawn from the illustrations FIG. 3 and FIG. 4. Usually, the circuit from FIG. 3 is employed.

Since only a half wave is used for the data transmission (the negative half wave, by way of example), it is possible to use the other half wave (the positive, by way of example) for energy transmission.

It is possible that a carrier signal is always supplied to the signal input 2. The circuits in the illustrations FIG. 3 and FIG. 4 serve to recover the desired signal from the modulated carrier signal by demodulation, while the modulator 11 in FIG. 5 serves in order for transmitting in the opposite direction, i.e. to modulate a carrier signal with a desired signal.

The modulator 11 comprises a load network 12 and a circuit switched network 13. The components capacitor 12.1 and a resistor 12.2 connected in series form the load network 12. The load network 12 should be essentially capacitive. Embodiments are possible with a parallel connection of the two, or generally of a load network 12 with a complex impedance.

The circuit switched network 13 comprises a switching transistor 13.1, more specifically a normal enhancement mode type p-channel MISFET (metal insulator semiconductor field effect transistor). A CMOS switch (complementary metal oxide semiconductor), n-channel MISFET or the like, can also be employed at this position.

With the use of a p-channel MISFET, the source terminal, regarding the DC voltage level, is connected to a positive voltage source 13.4. Since the alternating voltage signal of the load network 12 can introduce noise into the voltage supply 13.4, a passive filter consisting of, by way of example, a capacitor 13.3 and a resistor 13.2, is added to the circuit.

The gate of the transistor 13.1 is controlled via the input 13.5, which is maybe connected to a micro controller. Through the connection of the load network 12 by switching of the circuit switched network 13, in particular of the transistor 13.1, the load on the signal input 2 is changed and results in a change in the amplitude. The carrier signal can thus be modulated with a desired signal for the sending of data.

It is possible for the control pulse at the input 13.5, i.e. the connection of the load network 12, to always occur at a predetermined significant instant of the carrier signal. The load network is therewith synchronized with the carrier signal through a synchronization network 14 (see below). The advantage of the synchronization is that only in this way can it be secured that the load network 12 is always connected to the signal input 2 as the alternating voltage is crossing a zero point, for example, or always at peak voltage. Scattering in the signal is thereby advantageously avoided.

Figure 6:
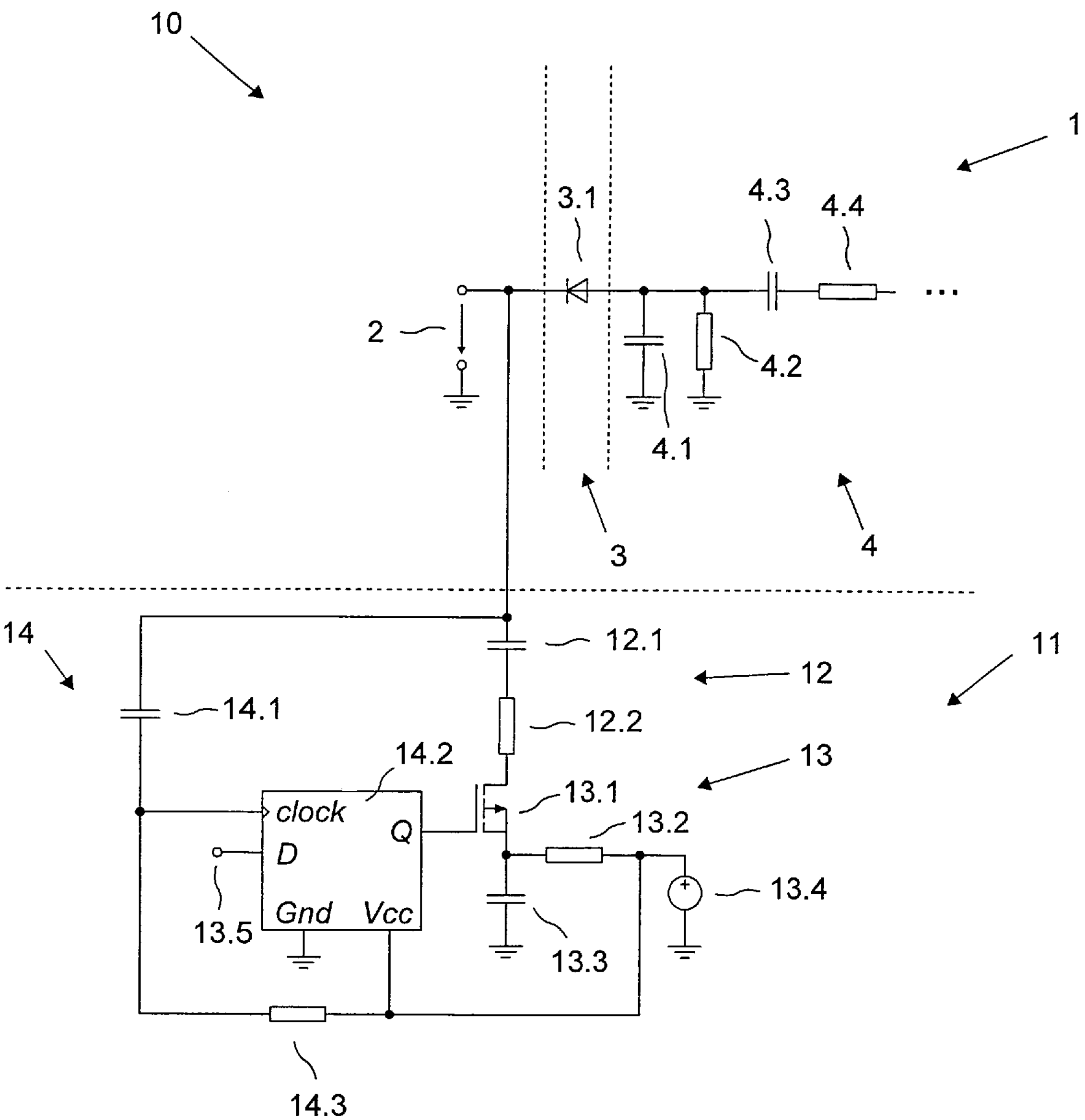
FIG. 6 is a possibility for the synchronization of the modulator and carrier signal.

A possibility for synchronization is shown in FIG. 6 with the synchronization network 14. The carrier signal at the signal input 2 is connected to the clock input of a D flip flop 14.2 via a capacitor 14.1. The circuit signal input 13.5 is connected to the data input D of the flip flop 14.2. The output Q of the D flip flop 14.2 is connected to the gate of the transistor 13.1. The energy supply of the D flip flop 14.2 can also occur via the voltage supply 13.4. Usually, the D flip flop 14.2 is constructed with CMOS technology. In order to lower the current usage, a resistor 14.3 can be interconnected in order to shorten the exposure time to invalid logic areas of the CMOS components.

The invention claimed is:

1. An electronic circuit for recovering a desired signal from a carrier signal by demodulation, wherein the to be demodulated carrier signal along with the desired signal, is inputted by a signal input, said circuit comprising:

a rectifier which passes only one polarity of the carrier signal;

at least one filter, subsequent to said rectifier, for the suppression of at least one frequency range of the carrier signal;

a comparator comprising two inputs;

a voltage matching network, subsequent to said filter, which is embodied so that it matches the voltage of the desired signal, and is connected to one of the two inputs of said comparator; wherein an output of said comparator is switched, depending on the difference between said two inputs; and a feedback network connected in parallel with said comparator, wherein:

said feedback network connects the other of said two inputs of said comparator with said output of said comparator, said feedback network comprises high-pass characteristic.

2. The electronic circuit according to claim 1, wherein: said feedback network is embodied as a positive feedback network.

3. The electronic circuit according to claim 1, further comprising:

an input coupling network, which is connected to said voltage matching network and precedes said comparator and is embodied so that it inputs a control signal.

4. The electronic circuit according to claim 3, wherein: said input coupling network is a capacitive coupling with a digital control signal.

5. The electronic circuit according to claim 1, wherein: said rectifier is a half wave rectifier, which comprises a diode.

6. The electronic circuit according to claim 1, wherein: said filter is a low-pass filter, high-pass filter or bandpass filter.

7. The electronic circuit according to claim 1, wherein: said filter comprises exclusively passive components.

8. A modem, comprising an electronic circuit for recovering desired signals from a carrier signal by demodulation, wherein the to be demodulated carrier signal along with the desired signals, is inputted by a signal input, said circuit comprising:

a rectifier which passes only one polarity of the carrier signal; at least one filter, subsequent to said rectifier, for the suppression of at least one frequency range of the carrier signal;

a comparator comprising two inputs; a voltage matching network, subsequent to said filter, which is embodied so that it matches the voltage of the desired signal, and is connected to one of the two inputs of said comparator;

wherein an output of said comparator is switched, depending on the difference between said two inputs; and a feedback network connected in parallel with said comparator, wherein: said feedback network connects the other of said two inputs of said comparator with said output of said comparator, said feedback network comprises high-pass characteristic;

a second electronic circuit for the modulation of a said carrier signal with said desired signal, wherein:

said carrier signal modulated by said desired signal is provided to a signal input, a load network; and a circuit switched network for connecting said load network to said signal input.

9. The modem, according to claim 8, wherein:

said circuit switched network comprises at least one switching transistor.

* * * * *